United States Patent
Park

(10) Patent No.: US 9,508,697 B2
(45) Date of Patent: Nov. 29, 2016

(54) SEMICONDUCTOR LIGHT EMITTING DEVICE AND SEMICONDUCTOR LIGHT EMITTING DEVICE PACKAGE INCLUDING THE SAME

(71) Applicant: SAMSUNG ELECTRONICS CO., LTD., Suwon-si (KR)

(72) Inventor: Jung Kyu Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/797,515

(22) Filed: Jul. 13, 2015

(65) Prior Publication Data

US 2016/0133615 A1    May 12, 2016

(30) Foreign Application Priority Data

Nov. 6, 2014    (KR) .................. 10-2014-0153578

(51) Int. Cl.
  *H01L 25/16* (2006.01)
  *H01L 33/38* (2010.01)
  *H01L 33/48* (2010.01)
  *H01L 33/44* (2010.01)
  *H01L 33/22* (2010.01)

(52) U.S. Cl.
  CPC ............ *H01L 25/16* (2013.01); *H01L 25/167* (2013.01); *H01L 33/382* (2013.01); *H01L 33/486* (2013.01); *H01L 33/22* (2013.01); *H01L 33/44* (2013.01); *H01L 2924/181* (2013.01); *H01L 2933/0033* (2013.01)

(58) Field of Classification Search
  CPC ..... H01L 25/16; H01L 33/486; H01L 33/52; H01L 33/54; H01L 33/36; H01L 33/38; H01L 33/22; H01L 33/20; H01L 33/40; H01L 2933/005
  See application file for complete search history.

(56) References Cited

U.S. PATENT DOCUMENTS

| 6,372,608 B1 | 4/2002 | Shimoda et al. |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| JP | 2012023328 A | 2/2012 |
|---|---|---|
| JP | 2014110332 A | 6/2014 |

(Continued)

OTHER PUBLICATIONS

Translation of KR 10-2014-0009624 which was published on Jan. 23, 2014.*

*Primary Examiner* — Matthew Landau
*Assistant Examiner* — Grant Withers
(74) *Attorney, Agent, or Firm* — Sughrue Mion, PLLC

(57) ABSTRACT

There is provided a semiconductor light-emitting device which includes a light-emitting diode (LED) chip having a first plane on which first and second electrodes are disposed and a second plane disposed opposite to the first plane, first and second solder bumps disposed in bonding areas of the first and second electrodes, respectively, and a protective device electrically connected to the first and second electrodes and mounted on the first plane of the LED chip. The protective device has the substantially same thickness as each of the first and second solder bumps.

20 Claims, 13 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,176,623 B2 * | 2/2007 | Nitta ............... H01L 33/56 257/100 |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,462,871 B2 * | 12/2008 | Han ............... H01L 25/167 257/81 |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,637,885 B2 | 1/2014 | Choi et al. |
| 8,735,931 B2 | 5/2014 | Han et al. |
| 8,766,295 B2 | 7/2014 | Kim |
| 2001/0020705 A1 * | 9/2001 | Miyata ............ H01L 25/0753 257/173 |
| 2002/0028527 A1 * | 3/2002 | Maeda ............. H01L 25/167 438/29 |
| 2004/0089872 A1 * | 5/2004 | Whitworth ........ H01L 23/60 257/99 |
| 2006/0012053 A1 | 1/2006 | Lai |
| 2006/0267040 A1 | 11/2006 | Baek et al. |
| 2007/0030611 A1 | 2/2007 | Cho et al. |
| 2009/0053840 A1 | 2/2009 | Chou et al. |
| 2011/0215342 A1 * | 9/2011 | Oliver ............... B29C 43/18 257/81 |
| 2012/0112237 A1 * | 5/2012 | Zheng ............. H01L 25/167 257/99 |
| 2015/0349232 A1 * | 12/2015 | Lee ............... H01L 33/647 257/91 |
| 2016/0218096 A1 * | 7/2016 | Lee ............... H01L 27/15 |

FOREIGN PATENT DOCUMENTS

| | | |
|---|---|---|
| KR | 200354011 Y1 | 6/2004 |
| KR | 1020100002998 A | 1/2010 |
| KR | 101041436 B1 | 6/2010 |
| KR | 101197778 B1 | 11/2012 |
| KR | 1020140009624 A | 1/2014 |

* cited by examiner

SEMICONDUCTOR LIGHT EMITTING DEVICE AND SEMICONDUCTOR LIGHT EMITTING DEVICE PACKAGE INCLUDING THE SAME

CROSS-REFERENCE TO RELATED APPLICATION

This application claims the priority and benefit of Korean Patent Application No. 10-2014-0153578 filed on Nov. 6, 2014, in the Korean Intellectual Property Office, which is incorporated herein in its entirety by reference.

BACKGROUND

1. Field

Apparatuses consistent with exemplary embodiments relate to a semiconductor light-emitting device and a semiconductor light-emitting device package including the same.

2. Description of the Related Art

In order to protect a light-emitting diode chip vulnerable to static electricity from damage thereby, a protective device such as a Zener diode is commonly used as an electrostatic discharge (ESD) protective device installed in a light-emitting diode (LED) package. Such an ESD protective device may be generally mounted on a lead frame in a package in which an LED chip is installed, in parallel with and adjacent to the LED chip.

In general, since a Zener diode is formed of a material absorbing light, such as silicon, light emission efficiency may decrease (optical interference). In addition, since a wire bonding process is used for electrical connectivity thereof, efficiency of a coating process of a phosphor may be reduced due to the wire (mechanical interference).

Meanwhile, the decrease in optical efficiency may be overcome by providing additional space for mounting the Zener diode. However, a package size may be increased in order to provide such additional space in the package. Such an increase in size may be directly linked with costs, which is undesirable.

SUMMARY

Exemplary embodiments of the inventive concept provide a method of removing optical and mechanical interference due to a protective device without increasing a package size.

According to an aspect of an exemplary embodiment, there is provided a semiconductor light-emitting device which may include an LED chip including a first plane on which first and second electrodes are disposed and a second plane disposed opposite to the first plane, first and second solder bumps disposed in bonding areas of the first and second electrodes, respectively, and a protective device electrically connected to the first and second electrodes and mounted on the first plane of the light-emitting diode chip. The protective device may have the substantially same thickness as the first and second solder bumps. The protective device may have a smaller thickness than each of the first and second solder bumps, and may be disposed in an area between the two solder bumps.

The semiconductor light-emitting device may further include an encapsulating layer covering side surfaces of the first and second solder bumps and a side surface of the protective device.

A lower surface of the encapsulating layer may be a planar surface.

The encapsulating layer may include a reflective powder.

The reflective powder may include at least one of $TiO_2$, $SiO_2$, and $Al_2O_3$.

Lower surfaces of the first and second solder bumps and a lower surface of the protective device may be disposed on the same plane.

The lower surface of the encapsulating layer and the lower surfaces of the first and second solder bumps may be disposed on the same plane The protective device may be a Zener diode.

The Zener diode may include first and second mounting electrodes disposed on a surface in contact with the first plane of the light-emitting diode chip.

The first and second mounting electrodes may be directly connected to the first and second solder bumps disposed on the bonding areas of the first and second electrodes, respectively.

The protective device may be formed of a material containing Si.

A material forming the lower surface of the protection diode may be undoped Si.

The protective device may have first and second mounting electrodes which may be connected to the first and second electrodes in parallel so as to have a reverse polarity to a polarity of the first and second electrodes.

The semiconductor light-emitting device may further include a first conductive-type semiconductor layer, a second conductive-type semiconductor layer, and an active layer interposed between the first and second conductive-type semiconductor layers, and the first and second electrodes may be disposed on upper surfaces of the first and second conductive-type semiconductor layers, respectively.

The semiconductor light-emitting device may further include an insulating layer disposed on the first and second conductive-type semiconductor layers, and a metal layer disposed on the insulating layer. The insulating layer may include a plurality of openings exposing the first and second electrodes, and the openings may be disposed below the first and second solder bumps.

The metal layer may be divided into a first metal layer and a second metal layer insulated from each other. The first electrode may be connected to the first metal layer through at least one of the openings, and the second electrode may be connected to the second metal layer through another at least one of the openings.

The semiconductor light-emitting device may further include a passivation layer which is disposed on the first and second metal layers, and includes a plurality of bonding portions exposing the first and second metal layers. Here, at least one bonding portion exposing the second metal layer may not be disposed on at least one opening exposing the second electrode. However, another at least one bonding portion exposing the first metal layer may be disposed on another at least one opening exposing the first electrode.

According to an aspect of another exemplary embodiment, there is provided a semiconductor light-emitting device which may include an LED chip including a first plane on which first and second electrodes are disposed and a second plane disposed opposite to the first plane, at least one first solder bump and at least one second solder bump disposed in bonding areas of the first and second electrodes, respectively, a protective device electrically connected to the first and second electrodes and disposed on the first plane of the light-emitting diode chip, and an encapsulating layer covering the first plane and including portions through which lower surfaces of the first and second solder bumps are exposed. A lower surface of the protective device may be coplanar with a lower surface of the encapsulating layer.

The protective device may be a Zener diode, and the Zener diode may include first and second mounting electrodes disposed on a surface in contact with the first plane of the light-emitting diode chip.

BRIEF DESCRIPTION OF DRAWINGS

The above and other aspects, features and advantages of the exemplary embodiments will be more clearly understood from the following detailed description taken in conjunction with the accompanying drawings, in which.

DETAILED DESCRIPTION

Figure 1:
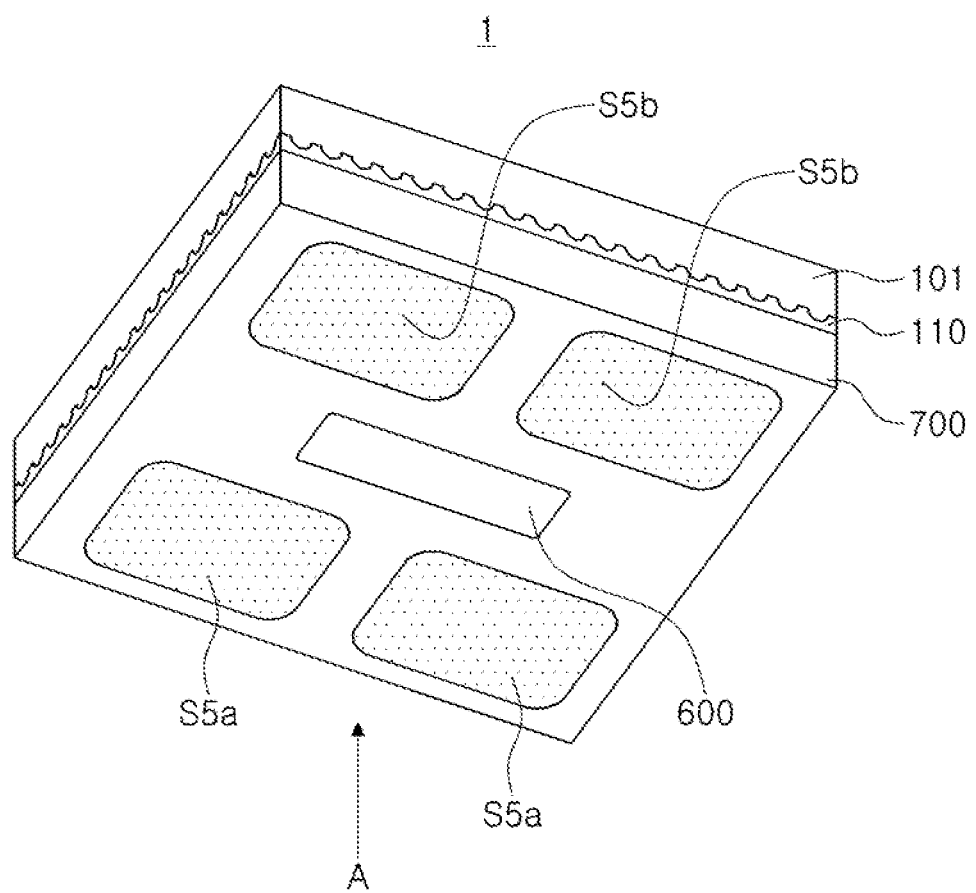
FIG. 1 is a perspective view schematically illustrating a semiconductor light-emitting device, according to an exemplary embodiment.

Various exemplary embodiments of the inventive concept will now be described more fully with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Figure 2:
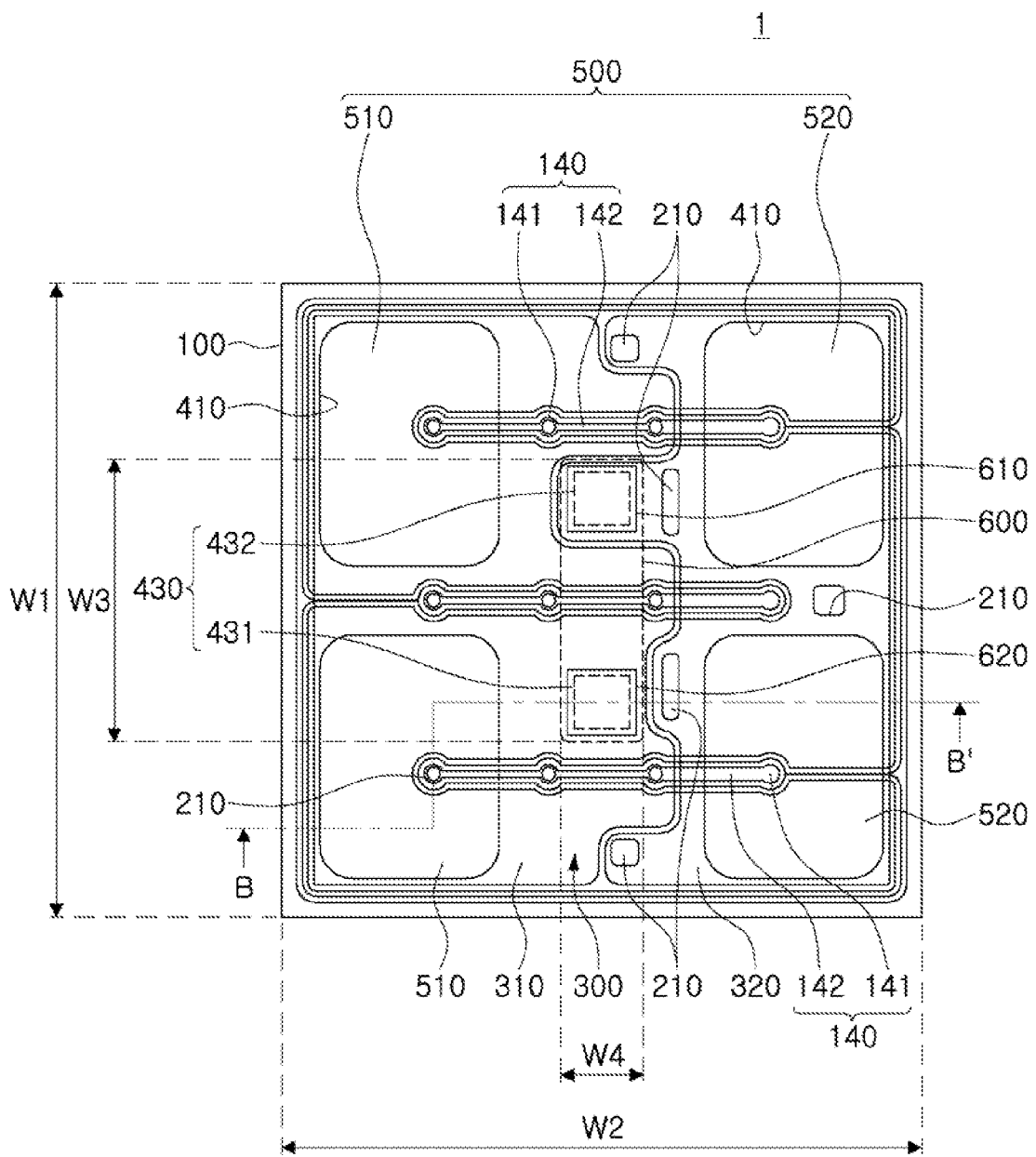
FIG. 2 is a plan view illustrating the semiconductor light-emitting device viewed in an "A" direction (from the bottom) in FIG. 1, according to an exemplary embodiment.
Figure 3:
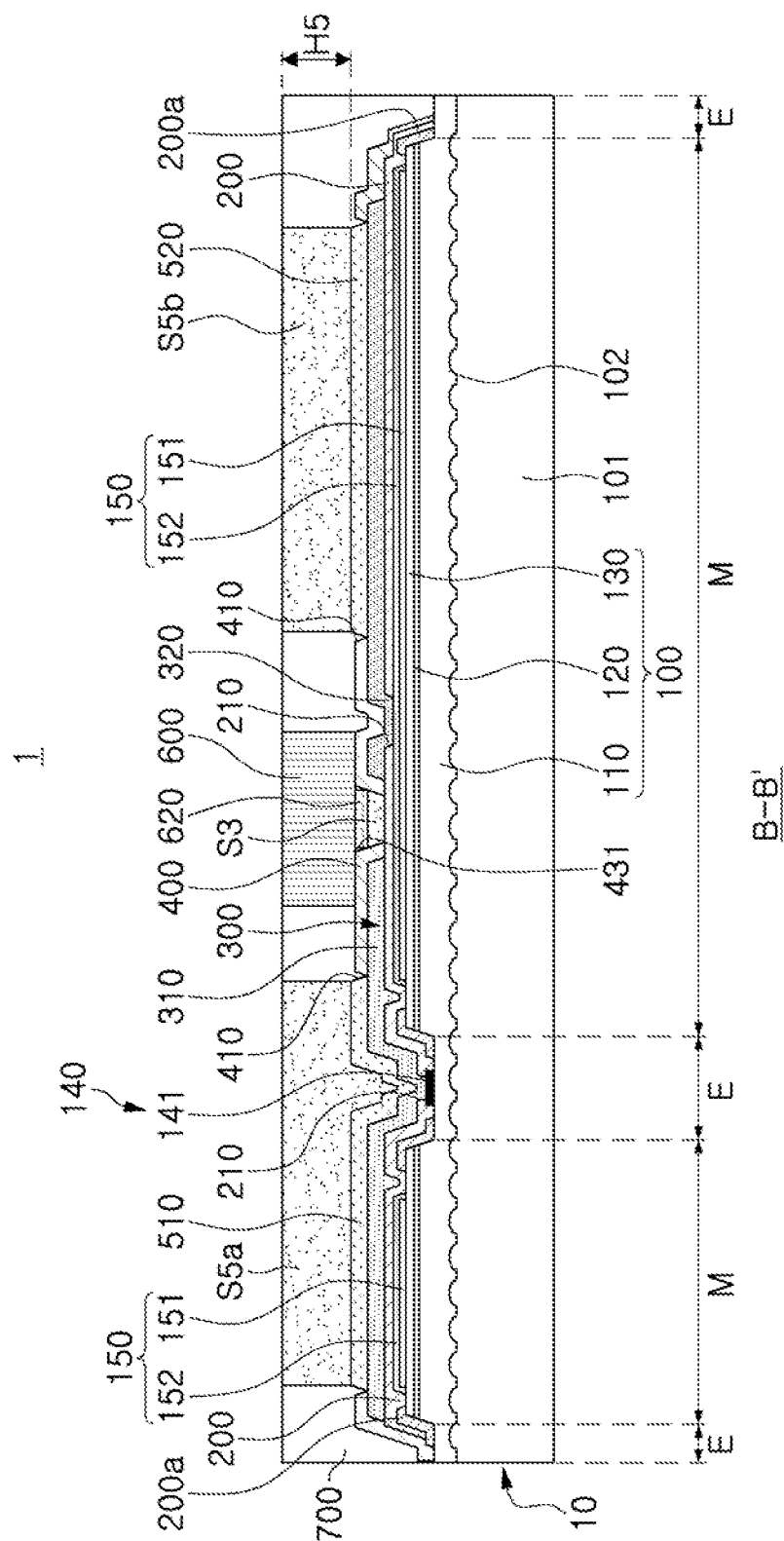
FIG. 3 is a cross-sectional view taken along line B-B' of the semiconductor light-emitting device in FIG. 2, according to an exemplary embodiment.

Referring to FIGS. 1 to 3, a semiconductor light-emitting device package according to an exemplary embodiment will be described. FIG. 1 is a perspective view schematically illustrating a semiconductor light-emitting device according to an exemplary embodiment, FIG. 2 is a plan view illustrating the semiconductor light-emitting device viewed in an "A" direction (from the bottom) in FIG. 1, and FIG. 3 is a cross-sectional view taken along line B-B' of the semiconductor light-emitting device in FIG. 2.

The semiconductor light-emitting device 1 according to the exemplary embodiment may include a light-emitting diode (LED) chip 10, first and second solder bumps S5a and S5b, and a protective device 600.

The LED chip 10 may include a light-emitting structure 100 and first and second electrodes 140 and 150, and have a first plane on which the first and second electrodes 140 and 150 are disposed, and a second plane disposed opposite to the first plane.

The light-emitting structure 100 may have a structure in which a plurality of semiconductor layer are stacked, and include a first conductivity-type semiconductor layer 110, an active layer 120, and a second conductivity-type semiconductor layer 130 sequentially stacked on the substrate 101.

The substrate 101 may have an upper surface extending in an x-direction and a y-direction. The substrate 101 may be provided as a growth substrate for a semiconductor material. The substrate 101 may be an insulating material, a conductive material, or a semiconductor material, such as sapphire, Si, SiC, $MgAl_2O_4$, MgO, $LiAlO_2$, $LiGaO_2$, and GaN. Sapphire, widely used as a growth substrate for a nitride semiconductor material, is a crystal body having Hexa-Rhombo R3c symmetry, has a lattice constant of 13.001 Å in a c-axis orientation and 4.758 Å in an a-axis orientation, and has a C-plane (0001), an A-plane (11-20), an R-plane (1-102), and the like. In this case, since the C-plane allows a nitride thin film to be relatively easily grown thereon and is stable even at high temperatures, sapphire is predominantly utilized as a growth substrate for a nitride.

In addition, as illustrated in the drawings, a plurality of protrusions 102 may be formed in one of two opposing surfaces of the substrate 101, on which the semiconductor layers are grown. The semiconductor layers may have improved levels of crystallinity and light emission efficiency by the protrusions 102. In the exemplary embodiment, the protrusions 102 may have a dome shape, but are not limited thereto. For example, the protrusions 102 may be formed in a variety of shapes, such as rectangular or a triangular. In addition, the protrusions 102 may be optionally formed and omitted in some embodiments.

Meanwhile, in some exemplary embodiments, the substrate 101 may be removed later. That is, after the substrate 101 is used as a growth substrate for growing the first conductivity-type semiconductor layer 110, the active layer 120, and the second conductivity-type semiconductor layer 130, the substrate 101 may be removed through a separation process. The separation of the substrate 101 may be performed using a process such as laser lift-off (LLO), chemical lift-off (CLO), or the like.

Although not illustrated in the drawings, a buffer layer may further be formed on an upper surface of the substrate 101. The buffer layer may function to mitigate lattice defects of a semiconductor layer grown on the substrate 101, and may be formed of an undoped semiconductor layer, such as a nitride material. The buffer layer may mitigate difference in lattice constants between the substrate 101 formed of, for example, sapphire and the first conductivity-type semiconductor layer 110 stacked on the upper surface of the substrate 101 and formed of GaN, to increase crystallinity. The buffer layer may be undoped GaN, AlN, or InGaN, and may be grown at a low temperature of 500° C. to 600° C. to have a thickness of several tens to several hundreds of angstrom. Here, "undoped" means the semiconductor layer does not undergo a separate impurity doping process, and a certain concentration level of impurities, which exist originally in the semiconductor layer, may be included. For example, when a gallium nitride semiconductor is grown using metal organic chemical vapor deposition (MOCVD), approximately $10^{14}$~$10^{18}$/cm$^3$ of Si may be included even if not intended. However, the buffer layer is non-essential and may be omitted in some embodiments.

The first conductivity-type semiconductor layer 110 stacked on the substrate 101 may be formed of a semiconductor doped with n-type impurities, such as an n-type nitride semiconductor layer. In addition, the second conductivity-type semiconductor layer 130 may be formed of a semiconductor doped with p-type impurities, such as a p-type nitride semiconductor layer. Alternatively, in some exemplary embodiments, positions of the first and second conductivity-type semiconductor layers 110 and 130 may be switched. The first and second conductivity-type semiconductor layers 110 and 130 may have a compositional formula of $Al_xIn_yGa_{(1-x-y)}N$ (wherein, 0≤x<1, 0≤y<1, and 0≤x+y<1), and may be, for example, GaN, AlGaN, InGaN, and AlInGaN.

The active layer 120 disposed between the first and second conductivity-type semiconductor layers 110 and 130 may emit light having a predetermined level of energy generated by electron-hole recombination. The active layer 120 may include a material having a smaller energy bandgap than the first and second conductivity-type semiconductor layers 110 and 130. For example, when the first and second conductivity-type semiconductor layers 110 and 130 are a GaN-based compound semiconductor, the active layer 120 may include an InGaN-based compound semiconductor having a smaller energy bandgap than GaN. In addition, the active layer 120 may have a multiple quantum well (MQW) structure, for example, an InGaN/GaN structure, in which quantum well layers and quantum barrier layers are alternately stacked. However, the active layer 120 may not be limited thereto, and may have a single quantum well (SQW) structure.

The light-emitting structure 100 may include an etched region E, in which portions of the second conductivity-type semiconductor layer 130, the active layer 120, and the first conductivity-type semiconductor layer 110 are etched, and a plurality of mesa regions M partially divided by the etched region E.

When viewed from above, the etched region E may have a gap structure in which the light-emitting structure 100 having a rectangular shape is cut from one side toward another side facing the one side in a predetermined thickness and length. In addition, a plurality of etched regions E may be arranged in parallel inside a rectangular-shaped region of the light-emitting structure 100. Accordingly, the plurality of etched regions E may be surrounded by the mesa regions M.

The first electrode 140 may be disposed on an upper surface of the first conductivity-type semiconductor layer 110 exposed on the etched region E and connected to the first conductivity-type semiconductor layer 110, and the second electrode 150 may be disposed on an upper surface of the plurality of mesa regions M and connected to the second conductivity-type semiconductor layer 130. The first and second electrodes 140 and 150 may be disposed on the first plane of the LED chip 10 on which the light-emitting structure 100 is disposed. Accordingly, the first and second electrodes 140 and 150 may be disposed on the same plane of the LED chip 10 such that the LED chip 10 is mounted on a package body 1002 (to be described later) in a flip-chip manner.

The first electrode 140 may include, as illustrated in FIG. 2, a plurality of pad portions 141 and a plurality of finger portions 142 extending from the plurality of pad portions 141 with smaller widths than the plurality of pad portions 141. The first electrode 140 may extend along the etched region E. In addition, a plurality of first electrodes 140 may be arranged at intervals to be uniformly distributed on the overall first conductivity-type semiconductor layer 110. Accordingly, currents flowing into the first conductivity-type semiconductor layer 110 through the plurality of first electrodes 140 may be uniformly distributed across the first conductivity-type semiconductor layer 110.

The plurality of pad portions 141 may be arranged to be spaced apart from one another, and the plurality of finger portions 142 may connect the plurality of pad portions 141. The plurality of finger portions 142 may have different widths from one another. For example, when the first electrode 140 has three finger portions 142 as illustrated in the exemplary embodiment, one of the finger portions 142 may have a greater width than the other finger portions 142. The width of the one finger portions 142 may be controlled in consideration of resistance of currents flowing thereto through the first electrode 140.

The second electrode 150 may include a reflective metal layer 151. In addition, the second electrode 150 may further include a covering metal layer 152 covering the reflective metal layer 151. However, the covering metal layer 152 may be optionally provided, and omitted in some exemplary embodiments. The second electrode 150 may cover an upper surface of the second conductivity-type semiconductor layer 130 defining upper surfaces of the mesa regions M.

Meanwhile, a first insulating layer 200*a* formed of an insulating material may be formed on the light-emitting structure 100 including side surfaces of the mesa regions M so as to cover the active layer 120 exposed by the etched region E. For example, the first insulating layer 200*a* may be formed of an insulating material including $SiO_2$, SiN, $SiO_xN_y$, $TiO_2$, $Si_3N_4$, $Al_2O_3$, TiN, AlN, $ZrO_2$, TiAlN, TiSiN, or the like. In addition, the first insulating layer 200*a* may be formed to expose the first and second electrodes 140 and 150. However, the first insulating layer 200*a* may be optionally provided, and omitted in some embodiments.

A second insulating layer 200 may be formed on the light-emitting structure 100 to cover the entire light-emitting structure 100. The second insulating layer 200 may be basically formed of a material having insulating characteristics, and formed of an inorganic or organic material. For example, the second insulating layer 200 may be formed of an epoxy-based insulating resin. In addition, the second insulating layer 200 may include silicon oxide or silicon nitride, and may be formed of, for example, $SiO_2$, SiN, $SiO_xN_y$, $TiO_2$, $Si_3N_4$, $Al_2O_3$, TiN, AlN, $ZrO_2$, TiAlN, or TiSiN.

The second insulating layer 200 may include a plurality of openings 210 disposed on each of the first electrode 140 and the second electrode 150. The plurality of openings 210 may be formed on an area corresponding to each of the first electrode 140 and the second electrode 150 to partially expose the first electrode 140 and the second electrode 150.

The openings 210 disposed on the first electrode 140 among the plurality of openings 210 may expose only the pad portions 141 among the pad portions 141 and the finger portions 142 in the first electrode 140. Accordingly, the plurality of openings 210 may be disposed on areas corresponding to the pad portions 141 on the first electrode 140.

A barrier metal layer 300 may be formed on the second insulating layer 200 and electrically connected to each of the first conductivity-type semiconductor layer 110 and the second conductivity-type semiconductor layer 130 through the plurality of openings 210.

As illustrated in FIG. 3, the barrier metal layer 300 may be isolated from the first and second conductivity-type semiconductor layers 110 and 130 by the second insulating layer 200 covering the overall upper surface of the light-emitting structure 100. In addition, the barrier metal layer 300 may be connected to the first electrode 140 and second electrode 150 partially exposed through the plurality of openings 210 and electrically connected to the first and second conductivity-type semiconductor layers 110 and 130.

The electrical connection between the barrier metal layer 300 and the first and second conductivity-type semiconductor layers 110 and 130 may be controlled by the plurality of openings 210 of the second insulating layer 200 in various manners. For example, the electrical connection between the barrier metal layer 300 and the first and second conductivity-type semiconductor layers 110 and 130 may be changed in various manners depending on the number and positions of the plurality of openings 210.

The barrier metal layer 300 may include at least a pair of a first metal layer 310 and a second metal layer 320. That is, the first metal layer 310 may be electrically connected to the first conductivity-type semiconductor layer 110 through the first electrode 140, and the second metal layer 320 may be electrically connected to the second conductivity-type semiconductor layer 130 through the second electrode 150. In this case, the openings 210 exposing the first electrode 140 may be disposed on areas overlapping the first metal layer 310, and the openings 210 exposing the second electrode 150 may be disposed on areas overlapping the second metal layer 320. In addition, the first and second metal layers 310 and 320 may be separated and electrically isolated from each other.

The barrier metal layer 300 may be formed of, for example, a material including at least one of Au, W, Pt, Si, Ir, Ag, Cu, Ni, Ti, Cr, and alloys thereof.

Meanwhile, the first electrode 140, which is disposed in an area overlapping the second metal layer 320 because the second metal layer 320 is disposed thereon, may need to be electrically isolated from the second metal layer 320. For this, the openings 210 exposing the pad portions 141 of the first electrode 140 may not be disposed on the area overlapping the second metal layer 320.

As illustrated in FIG. 2, when the first electrode 140 includes four pad portions 141 and three finger portions 142, the openings 210 exposing the pad portions 141 may be only disposed on the three pad portions 141 disposed on the area overlapping the first metal layer 310, and may not be disposed on the other pad portions 141 overlapping the second metal layer 320. Accordingly, the pad portions 141 of the first electrode 140 disposed below the first metal layer 310 may be connected to the first metal layer 310 through the openings 210, but electrically isolated from the second metal layer 320 since the openings 210 are not formed on the pad portions 141 disposed below the second metal layer 320. Thus, through such an arrangement of the plurality of openings 210 partially exposing the first electrode 140 or the second electrode 150, the first metal layer 310 may be connected to the first electrode 140 and the second metal layer 320 may be connected to the second electrode 150.

A passivation layer 400 may be disposed on the barrier metal layer 300 and cover the overall barrier metal layer 300. In addition, the passivation layer 400 may include a bonding portion 410 partially exposing the barrier metal layer 300.

A plurality of bonding portions 410 may be formed to partially expose each of the first metal layer 310 and the second metal layer 320. In this case, some of the plurality of bonding portions 410 may not overlap some of the plurality of openings 210 of the second insulating layer 200. For example, as illustrated in FIG. 2, some of the bonding portions 410 partially exposing the second metal layer 320 may not overlap some of the plurality of openings 210 partially exposing the second electrode 150. That is, the bonding portion 410 may not disposed vertically on the openings 210. In addition, the bonding portion 410 partially exposing the first metal layer 310 may partially overlap the openings 210 partially exposing the first electrode 140.

In the present exemplary embodiment, four bonding portions 410 are arranged symmetrically, but are not limited thereto. The number and arrangement of the bonding portion 410 may be variously modified.

The passivation layer 400 may be formed of the same material as the second insulating layer 200.

Meanwhile, the passivation layer 400 may further include an open area 430 partially exposing the first and second metal layers 310 and 320, similarly to the bonding portion 410. Such an open area 430 may be provided as an area connected to a probe pin (not shown) in order to determine whether the LED chip 10 properly operates, before the protective device 600 is installed. The open area 430 may be configured with first and second open areas 431 and 432 respectively exposing first and second metal layers 310 and 320.

A solder pad 500 may include a first solder pad 510 and a second solder pad 520 to be respectively connected to the first and second metal layers 310 and 320 partially exposed through the bonding portion 410. In addition, the first solder pad 510 and the second solder pad 520 may be respectively electrically connected to the first conductivity-type semiconductor layer 110 and second conductivity-type semiconductor layer 130 through the barrier metal layer 300.

The first solder pad 510 and second solder pad 520 may be, for example, under bump metallurgy (UBM) layers. In addition, one or a plurality of first solder pads 510 and second solder pads 520 may be provided. In the exemplary embodiment, two first solder pads 510 and two second solder pads 520 are provided, but are not limited thereto. The number and arrangement of the first solder pads 510 and the second solder pads 520 may be controlled depending on the bonding portion 410.

The first and second solder bumps S5a and S5b may be respectively disposed on the first and second solder pads 510 and 520. The first and second solder bumps S5a and S5b may be a conductive adhesive material for the LED chip 10 to be mounted on a package substrate in a flip-chip manner. The first and second solder bumps S5a and S5b may include Sn and may include a small amount of Ag or Cu. The first and second solder bumps S5a and S5b may have a thickness of H5, which is the same as or greater than a thickness of the protective device 600 to be described later.

The first and second solder bumps S5a and S5b may be used for the LED chip 10 to be mounted on the package substrate in a subsequent process.

The protective device 600 may be electrically connected to the first and second electrodes 140 and 150, and mounted on a plane in which the first and second electrodes 140 and 150 of the LED chip 10 are disposed. The thickness of the protective device 600 may be substantially the same or greater than the thickness H5 of the first and second solder bumps S5a and S5b.

The protective device 600 may be formed of a Zener diode, and the Zener diode may be formed of a material including Si. The Zener diode may be a semiconductor PN junction diode, which is fabricated to show operation characteristics in a PN junction breakdown area and usually used for a constant voltage operation.

The protective device 600 may be electrically connected to the LED chip 10 in parallel. Accordingly, even when reverse-biased currents flow into the LED chip 10 due to static electricity, the LED chip 10 may be prevented from being damaged since the currents are bypassed through the protective device 600.

Generally, the semiconductor light-emitting device such as LED has a significantly great energy bandgap due to short-wavelength light emission thereof, but is vulnerable to electrostatic discharge (ESD) due to crystal defects therein. Furthermore, the semiconductor light-emitting device may be more vulnerable to a reverse bias ESD than a forward bias ESD.

Due to such characteristics of the semiconductor light-emitting device, when ESD occurs, a lifespan of the semiconductor light-emitting device may be rapidly decreased and reliability of a product thereof may be degraded. Thus, a protective device such as a Zener diode may be connected to the semiconductor light-emitting device in parallel to protect the semiconductor light-emitting device from the reverse bias ESD.

However, since such a method requires an additional Zener diode to be mounted inside a package in which a semiconductor light-emitting device is mounted, in parallel to the semiconductor light-emitting device, a size of the package may increase in order to provide an additional area in the package. In addition, since the Zener diode is formed of a material that absorbs light, such as Si, the Zener diode may absorb light emitted from the semiconductor light-emitting device and reduce external light extraction efficiency of the semiconductor light-emitting device package. Furthermore, efficiency of a coating process of a phosphor may be decreased due to a wire used when the Zener diode is wire-bonded for electrical connection.

In order to address these problems, according to an exemplary embodiment, the protective device 600 is directly attached to the LED chip 10. In particular, in order to prevent a decrease of the external light extraction efficiency, the protective device 600 may be mounted on an area which does not affect the external light extraction efficiency, such as an area between first and second solder bumps S5a and S5b.

A shape of the protective device 600 and a mounting position thereof will be described in more detail.

The protective device 600 according to the exemplary embodiment may be disposed on a plane in which the first and second solder bumps S5a and S5b of the LED chip 10 are disposed, and have a substantially the same thickness as or a smaller thickness than the first and second solder bumps S5a and S5b.

First and second mounting electrodes 610 and 620 electrically connected to the LED chip 10 may be disposed on the plane attached to the LED chip 10 of the protective device 600 to apply power.

The first and second mounting electrodes 610 and 620 of the protective device 600 may be mounted to be respectively connected to the first and second solder bumps S5a and S5b of the LED chip 10. Alternatively, as illustrated in FIGS. 2 and 3, the first and second mounting electrodes 610 and 620 of the protective device 600 may be mounted on the first and second open areas 431 and 432 to which probe pins (not shown) are connected to determine whether the LED chip 10 is properly operating. Since the first and second open areas 431 and 432 are normally disposed on a plane on which the semiconductor light-emitting device 1 is mounted, when the protective device 600 is mounted thereon, the problem of the decrease in the external light extraction efficiency due to the protective device 600 may be solved.

However, when the protective device 600 is mounted on the first and second open areas 431 and 432, there is a problem in that a thickness of the protective device 600 is greater than thicknesses of the solder bumps S5a and S5b, which causes a problem in that the semiconductor light-emitting device 1 is not mounted on the package substrate. However, such a problem may not occur in some embodiments. For example, when the protective device 600 is thinner than the solder bumps S5a and S5b, the problem may not occur.

This will be described in detail. As illustrated in FIG. 2, the protective device 600 may normally have a length W3 by a width W4 of about 0.4 mm×0.2 mm, and a thickness of about 0.1 mm. In addition, the LED chip 10 may have a length W1 by a width W2 of about 1 mm×1 mm, and the solder bumps S5a and S5b may have a thickness of about 60 μm to 70 μm. Accordingly, when the protective device 600 is disposed between the solder bumps S5a and S5b, the LED chip 10 may not be attached to the package since the protective device 600 may protrude between the solder bumps S5a and S5b.

In order to address the problem, according to an exemplary embodiment, a surface of the protective device 600 is ground until the protective device 600 has a predetermined thickness H5 such that the thickness of the protective device 600 is not greater than the thicknesses of the first and second solder bumps S5a and S5b, as illustrated in FIG. 3. Here, surfaces of the first and second solder bumps S5a and S5b may also be ground along with the protective device 600 such that the thicknesses of the protective device 600 and the first and second solder bumps S5a and S5b are substantially the same. This will be described again in description of a process of fabricating the semiconductor light-emitting device 1.

Accordingly, since the semiconductor light-emitting device 1 having such a configuration may allow the protective device 600 to be mounted on a lower surface of the LED chip 10, optical and mechanical interference by the protective device 600 may be removed.

An encapsulating layer 700 covering side surfaces of the first and second solder bumps S5a and S5b and side surfaces of the protective device 600 may be formed on the LED chip 10.

The encapsulating layer 700 may be formed by coating or molding a lower surface of the LED chip 10 with, for example, a resin such as polycarbonate (PC), polymethyl methacrylate (PMMA), acrylic, epoxy, or ABS, and solidifying it.

When the encapsulating layer 700 is solidified and ground to expose the first and second solder bumps S5a and S5b, upper surfaces of the first and second solder bumps S5a and S5b and an upper surface of the protective device 600 may be coplanar.

The encapsulating layer 700 may include a reflective powder to improve the external light extraction efficiency. As the reflective powder, high-reflective metal powder or a white ceramic powder, such as $SiO_2$, $TiO_2$, or $Al_2O_3$.

However, the encapsulating layer 700 may be optionally provided, and omitted in some embodiments.

Next, a process of fabricating the semiconductor light-emitting device of FIG. 1 will be described. FIGS. 4A to 8 are views illustrating main processes of fabricating the semiconductor light-emitting device of FIG. 1. In FIGS. 4A to 8, the same reference numerals as those in FIGS. 1 to 3 represent the same elements, and accordingly duplicated descriptions will be omitted.

Figure 4A:
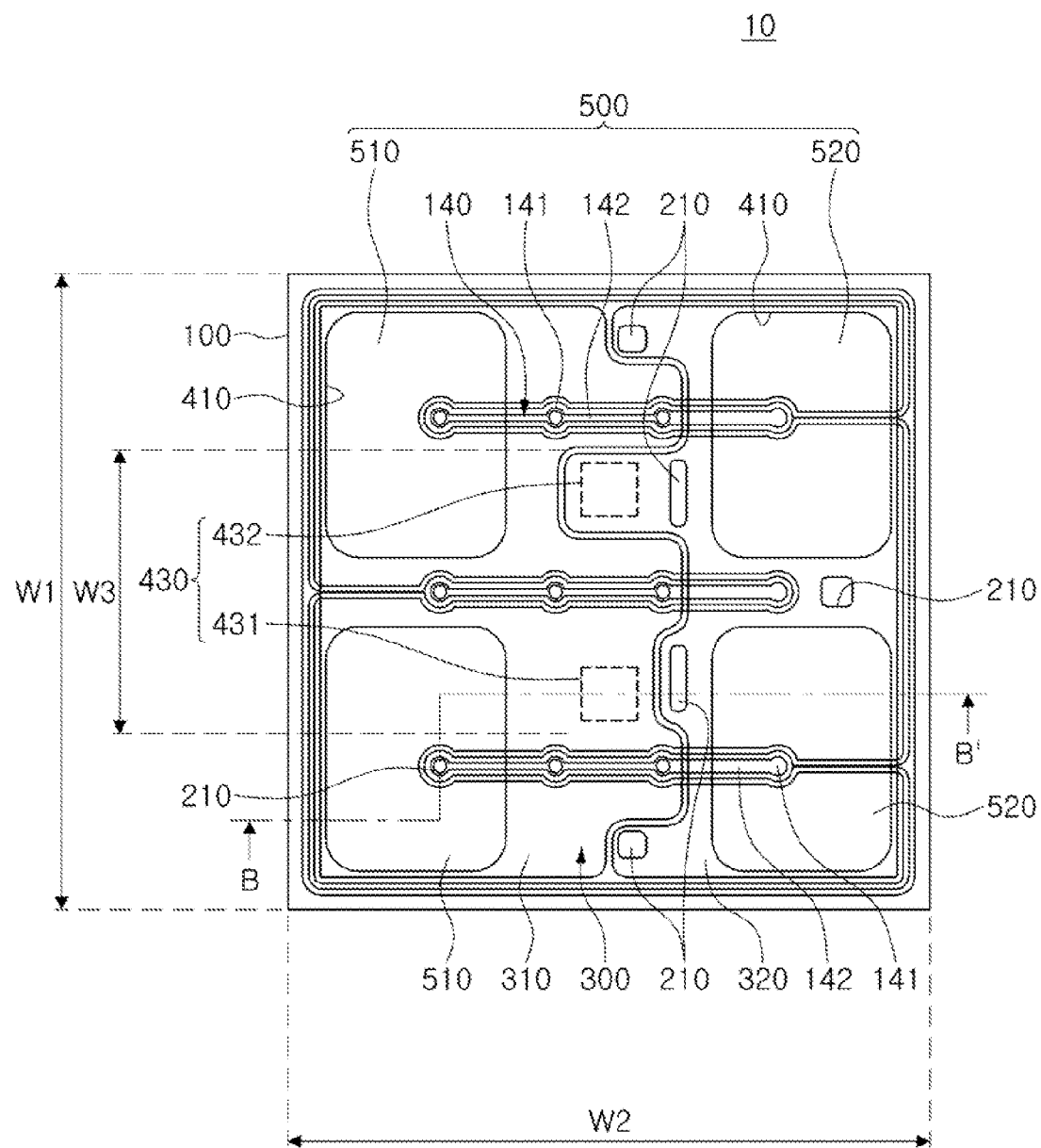
FIGS. 4A to 8 are views illustrating main processes of fabricating the semiconductor light-emitting device of FIG. 1, according to exemplary embodiments.
Figure 4B:
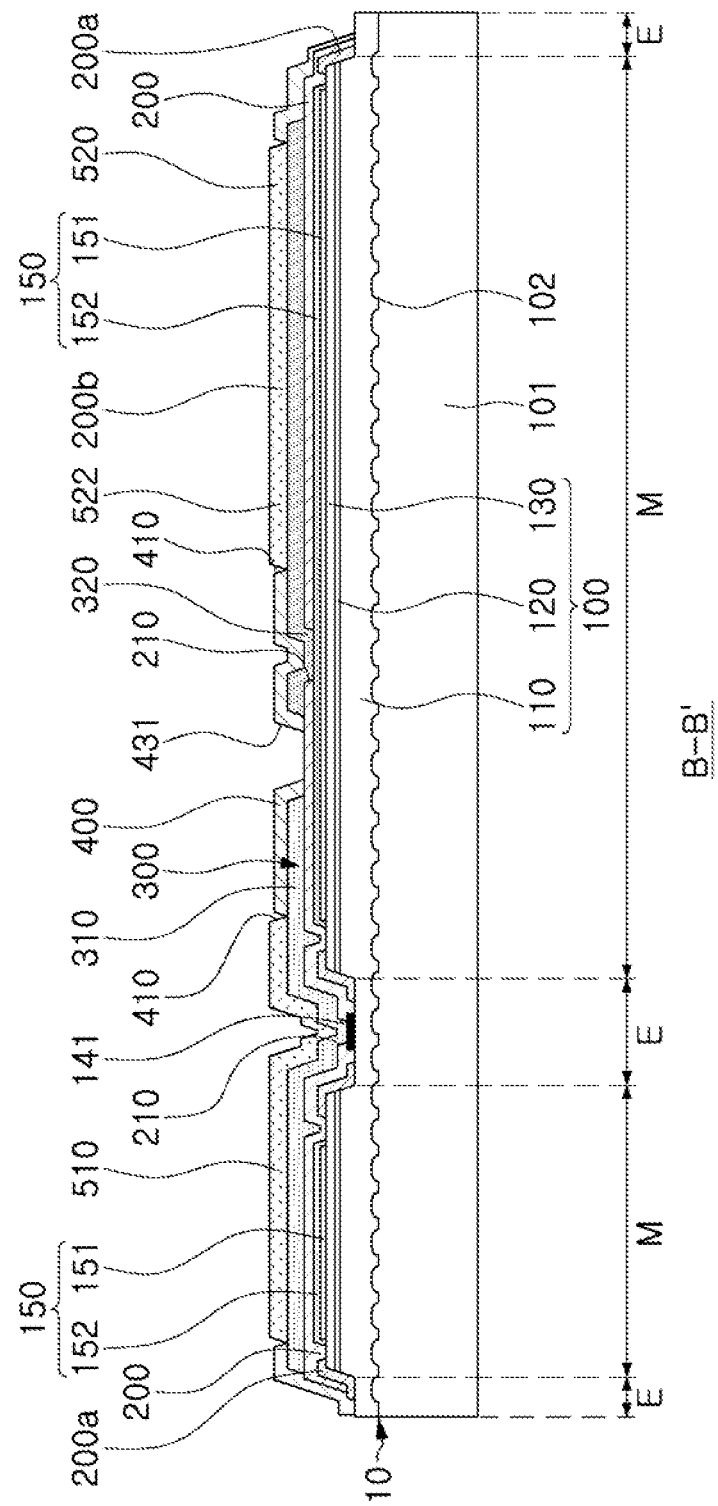

Referring to FIGS. 4A and 4B, FIG. 4A is a plan view illustrating a light-emitting structure 100 formed on a substrate 101, and FIG. 4B is a cross-sectional view taken along line B-B' of FIG. 4A. The following FIGS. 5 to 8 are illustrated in the same manner.

First, as illustrated in FIGS. 4A and 4B, a LED chip 10 is prepared. The LED chip 10 may further include an open area 430 partially exposing first and second metal layers 310 and 320. The open area 430 may include a first open area 431 and a second open area 432. The open area 430 may be provided to determine whether the LED chip 10 properly operates before the protective device 600 is installed, and the operation of the LED chip 10 may be determined by contacting a probe pin (not shown) to the first and second metal layers 310 and 320 exposed in the open area 430.

Figure 5:
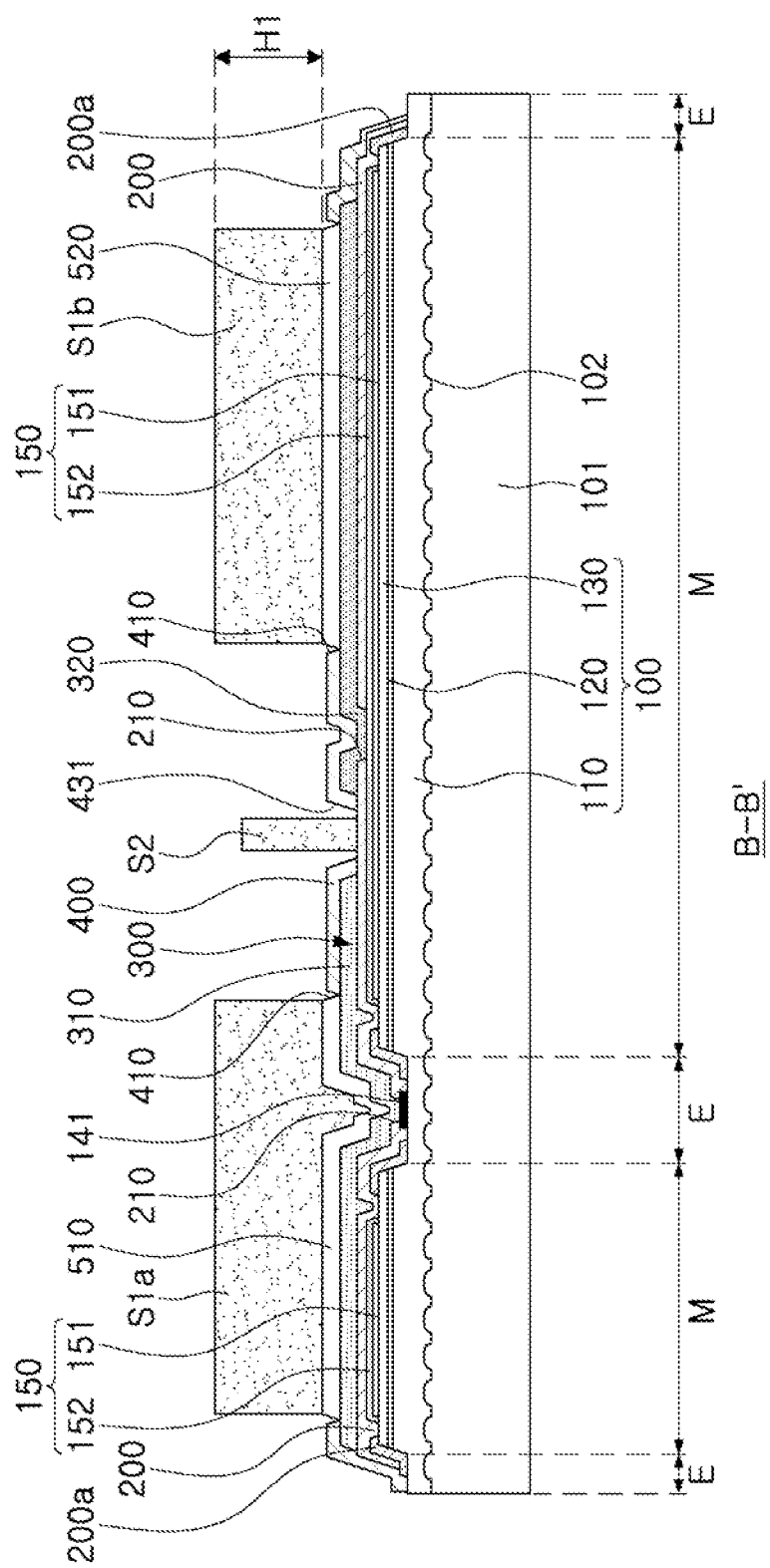

Next, as illustrated in FIG. 5, solder pastes S1 (S1a and S1b) and S2 may be respectively printed on first and second solder pads 510 and 520, and the first open area 431. Although the solder paste S2 is only printed on the first open area 431 in FIG. 5, the solder paste S2 may also be printed on the second open area 432.

Figure 6:
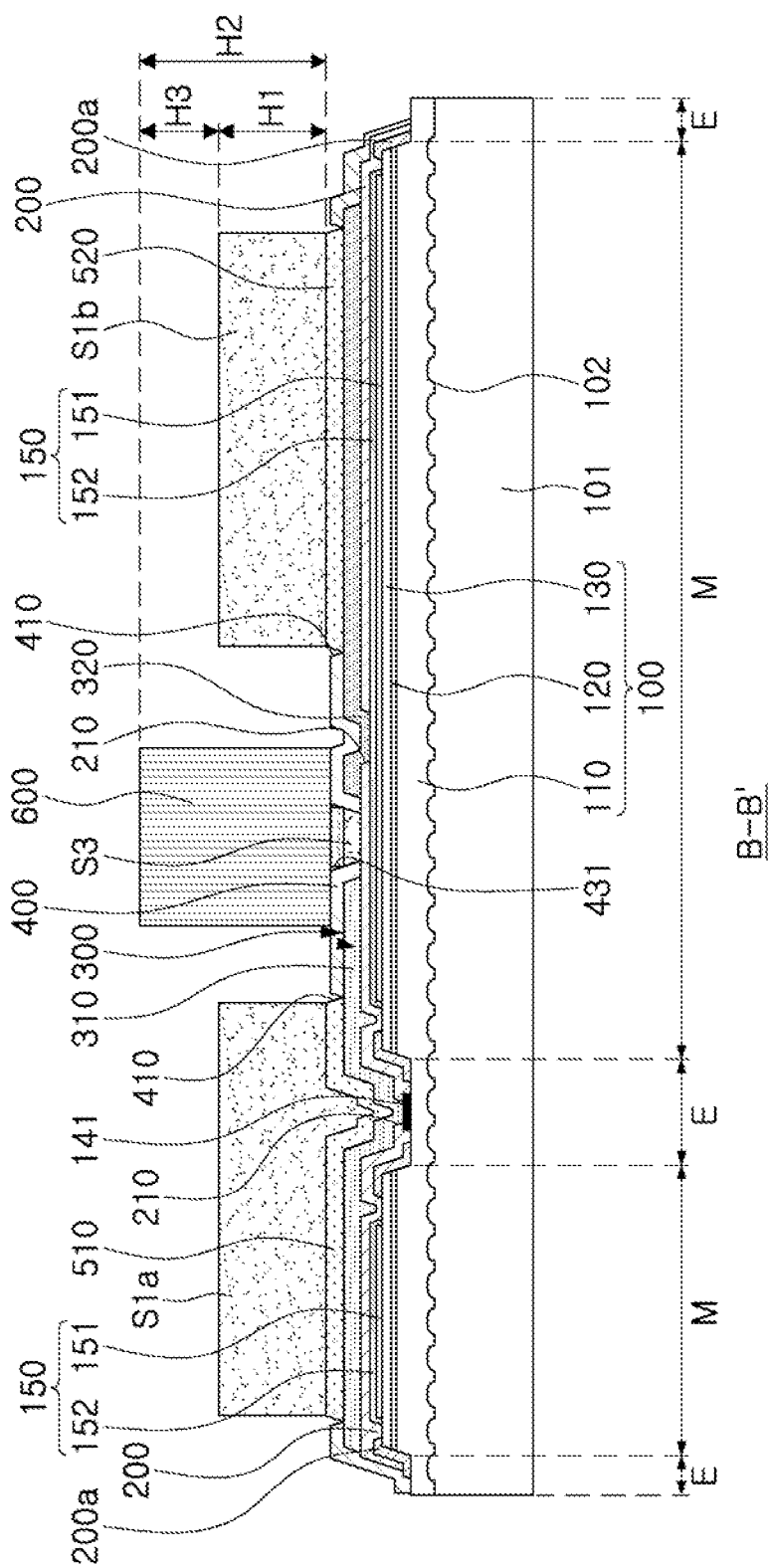

Next, as illustrated in FIG. 6, a protective device 600 may be mounted on the first open area 431. The mounting of the protective device 600 may be performed by mounting the protective device 600 on the above-described solder paste S2, and heating and solidifying the solder paste S2 to form a solder S3. Although the protective device 600 is illustrated as being mounted only on the first open area 431 in FIG. 6, the protective device 600 may also be mounted on the second open area 432. In this case, as described above, since a thickness H2 of the protective device 600 is normally greater than thicknesses H1 of the solder pastes S1 (S1a and S1b) by the amount of H3, the protective device 600 may protrude more than the solder paste S1 (S1a and S1b).

Figure 7:
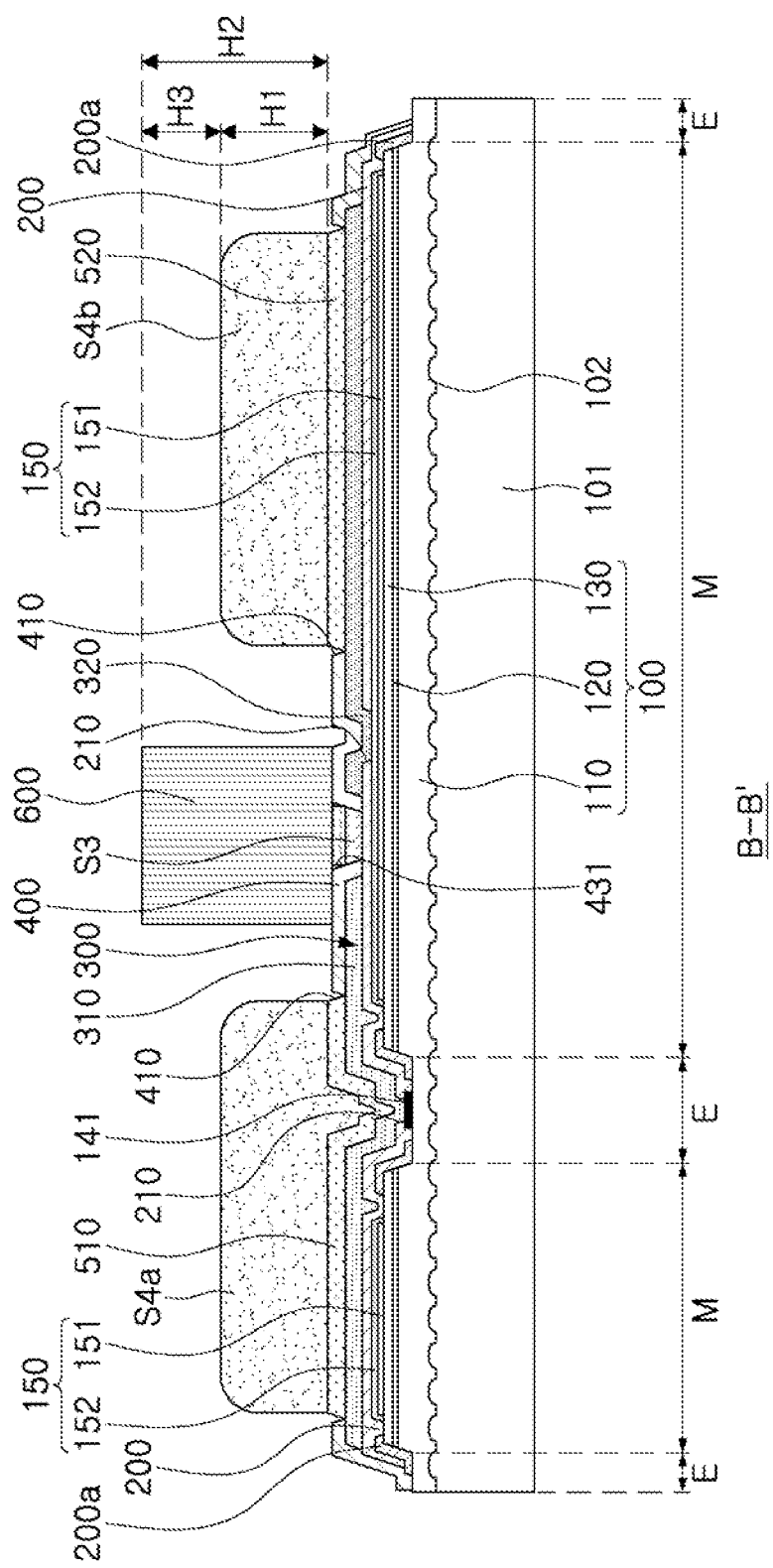

Next, first and second solder bumps S4a and S4b illustrated in FIG. 7 may be formed by reflowing the solder paste S1 (S1a and S1b) of the first and second solder pads 510 and 520. When the protective device 600 protrudes more than the solder paste S1 (S1a and S1b) in the previous process, the protective device 600 may still protrude more than the solder paste S1 (S1a and S1b) in this process.

Figure 8:
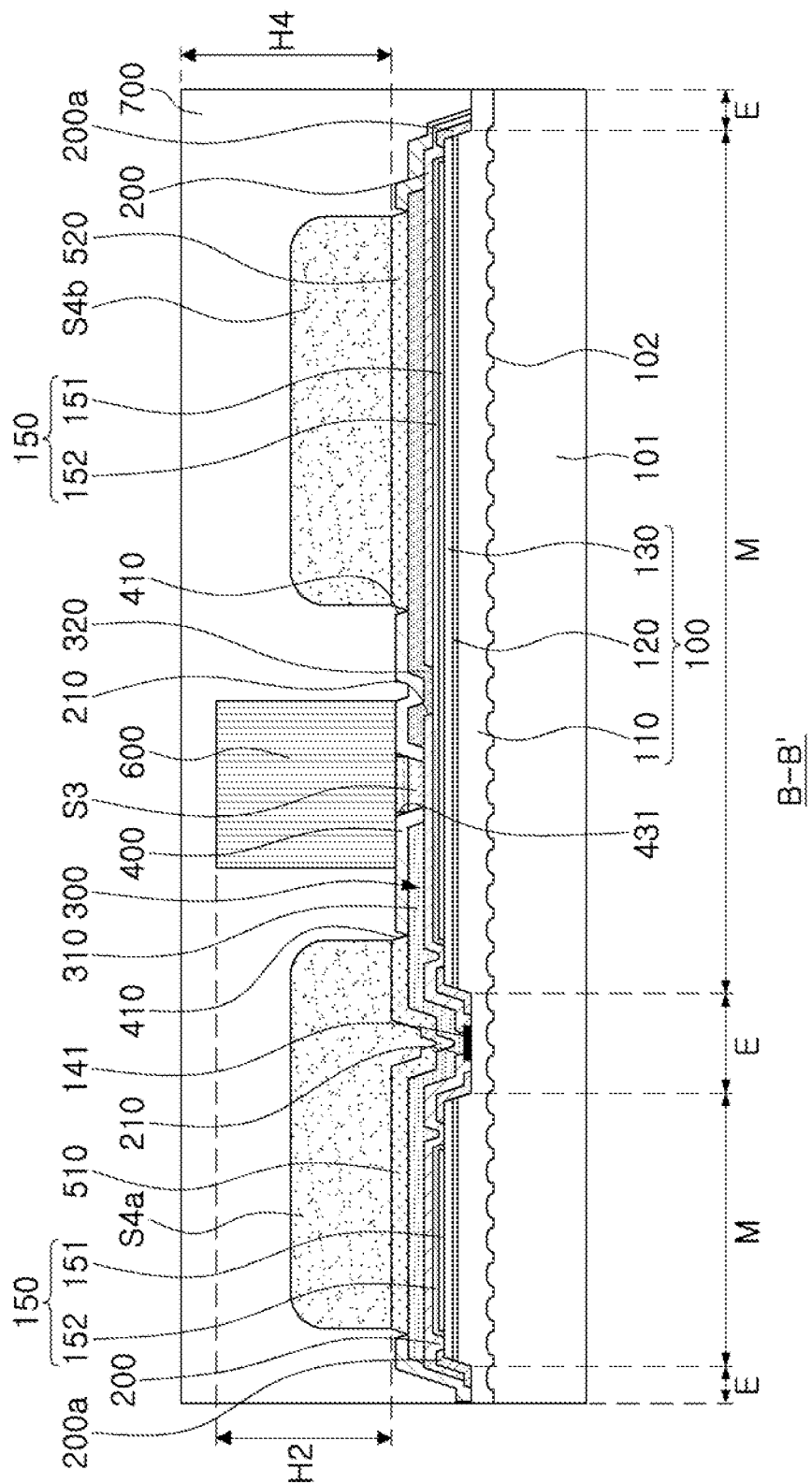

Next, as illustrated in FIG. 8, an encapsulating layer 700 may be formed to cover the solder paste S1 (S1a and S1b) of the first and second solder pads 510 and 520 and the protective device 600. A thickness H4 of the encapsulating layer 700 may be greater than the thickness H2 of the protective device 600 to encapsulate the protective device 600, but is not limited thereto. The thickness H4 of the encapsulating layer 700 may be the same as the thickness H2 of the protective device 600 to expose an end portion of the protective device 600.

The semiconductor light-emitting device package illustrated in FIG. 3 may be fabricated by grinding a surface of the encapsulating layer 700 to a predetermined thickness H5 to expose the first and second solder bumps S4a and S4b. In some exemplary embodiments, the surface of the encapsulating layer 700 may be ground to a thickness H1 in FIG. 6 to expose the first and second solder bumps S4a and S4b.

In this process, a portion of the protective device 600 may be ground to be removed. However, since a plane opposite to a plane on which the first and second mounting electrodes 610 and 620 of the protective device 600 are disposed are ground, the portion to be ground and removed may be limited to an undoped Si region of the protective device 600. Accordingly, even when the portion of the protective device 600 is ground and removed, electrical characteristics of the protective device 600 may not be changed. Accordingly, in the exemplary embodiment, since the protective device 600 maintain functions as the protective device even when the portion thereof is removed, the semiconductor light-emitting device 1 in which the protective device 600 is mounted may be fabricated.

Figure 9:
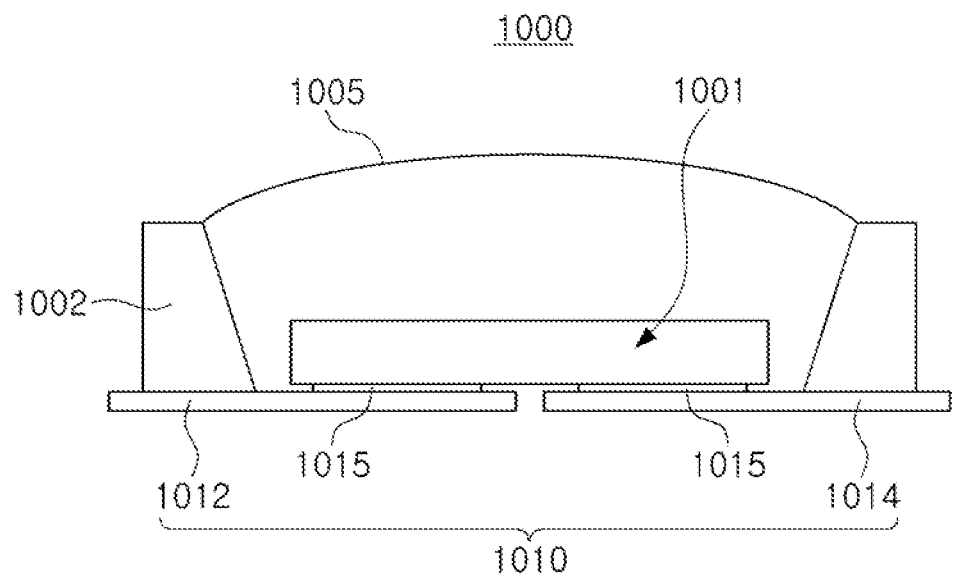
FIGS. 9 and 10 are cross-sectional view illustrating examples in which a semiconductor light-emitting device according to an exemplary embodiment is applied to a semiconductor light-emitting device package.
Figure 10:
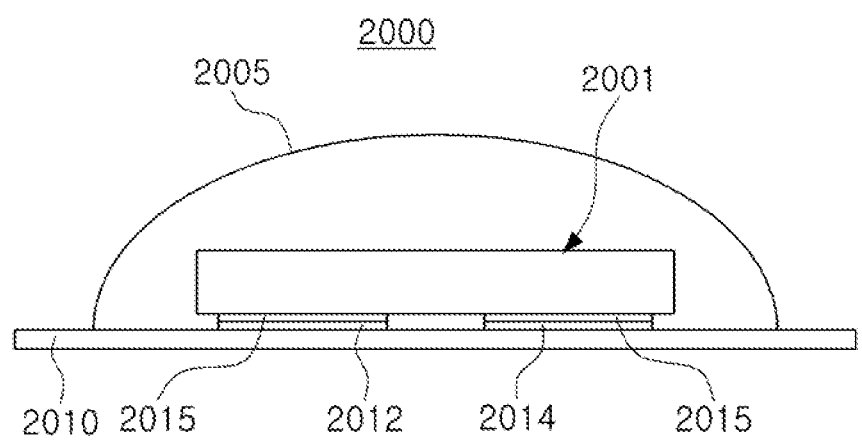

FIGS. 9 and 10 are cross-sectional view schematically illustrating examples in which a semiconductor light-emitting device according to an exemplary embodiment is applied to a semiconductor light-emitting device package.

Referring to FIG. 9, a semiconductor light-emitting device package 1000 may include a semiconductor light-emitting device 1001, which is a light source, a package body 1002, a pair of lead frames 1010, and an encapsulating layer 1005. Here, the semiconductor light-emitting device 1001 may be the semiconductor light-emitting device 1 of FIG. 1, and thus descriptions thereof will be omitted.

The semiconductor light-emitting device 1001 may be mounted on the lead frame 1010, and electrically connected to the lead frame 1010 through a conductive adhesive material. The conductive adhesive material may be, for example, the first and second solder bumps S5a and S5b of the semiconductor light-emitting device 1, but is not limited thereto. That is, an additional conductive adhesive material 1015 may be further applied. The pair of lead frames 1010 may include a first lead frame 1012 and a second lead frame 1014.

The package body 1002 may include a reflective cup in order to improve light reflection efficiency and light extraction efficiency. The encapsulating layer 1005 formed of a light-transmissive material may be disposed in the reflective cup in order to encapsulate the semiconductor light-emitting device 1001.

Referring to FIG. 10, a semiconductor light-emitting device package 2000 may include a semiconductor light-emitting device 2001, a mounting substrate 2010, and an encapsulating layer 2005. Here, the semiconductor light-emitting device 2001 may be the semiconductor light-emitting device 1 of FIG. 1, and thus descriptions thereof will be omitted.

The semiconductor light-emitting device 2001 may be mounted on the mounting substrate 2010 to be electrically connected to first and second circuit patterns 2012 and 2014 through conductive adhesive material. The conductive adhesive material may be, for example, the first and second solder bumps S5a and S5b of the semiconductor light-emitting device 1, but is not limited thereto. That is, an additional conductive adhesive material 2015 may be further applied. In addition, the semiconductor light-emitting device 2001 may be encapsulated by the encapsulating layer 2005. Thus, a chip-on-board (COB) type package structure may be implemented.

The mounting substrate 2010 may be a printed circuit board (PCB), metal-core PCB (MCPCB), multilayered PCB (MPCB), or flexible PCB (FPCB), and the structure of the mounting substrate 2010 may be modified in various forms.

Figure 11:
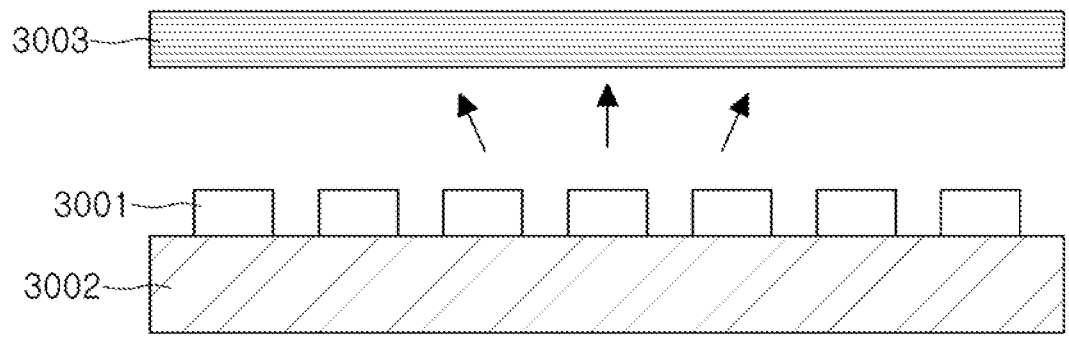
FIGS. 11 and 12 illustrate examples in which a semiconductor light-emitting device package according to an exemplary embodiment is applied to a backlight unit.
Figure 12:
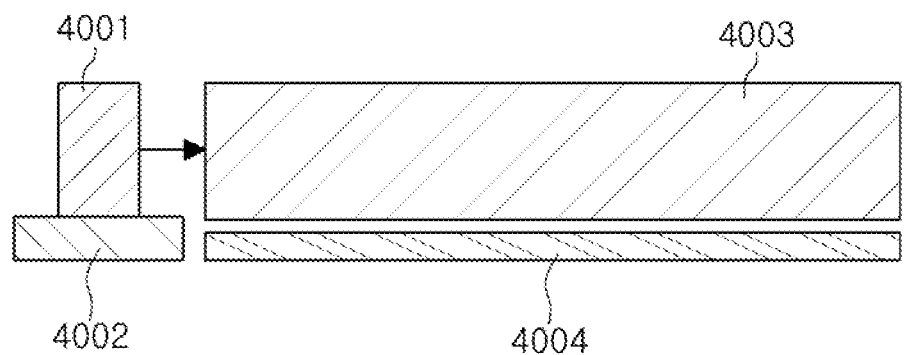

FIGS. 11 and 12 illustrate examples in which a semiconductor light-emitting device according to an exemplary embodiment is applied to a backlight unit.

Referring to FIG. 11, a backlight unit 3000 may include a light source 3001 mounted on a substrate 3002, and one or more optical sheets 3003 disposed on the light source 3001. The light source 3001 may include a semiconductor light-emitting device package having the structure described with reference to FIGS. 9 and 10 or a structure similar thereto. In addition, the semiconductor light-emitting device may be directly mounted on the substrate 3002 (a so called COB type).

The light source 3001 in the backlight unit 3000 illustrated in FIG. 11 emits light toward a top surface where a liquid crystal display (LCD) is disposed. On the contrary, in another backlight unit 4000 illustrated in FIG. 12, a light source 4001 mounted on a substrate 4002 emits light in a lateral direction, and the emitted light may be incident to a light guide plate 4003 and converted to the form of surface light. Light passing through the light guide plate 4003 is emitted upwardly, and a reflective layer 4004 may be disposed on a bottom surface of the light guide plate 4003 to improve light extraction efficiency.

Figure 13:
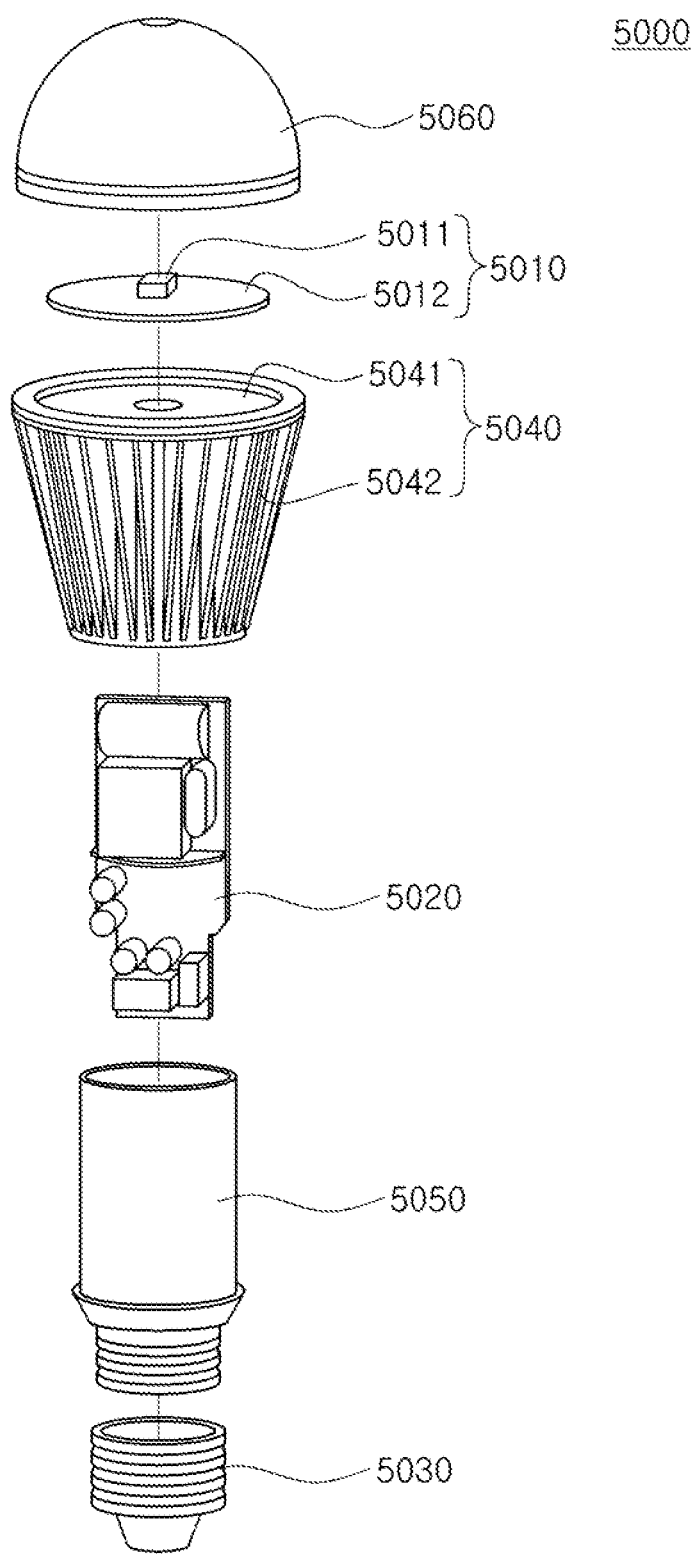
FIG. 13 illustrates an example in which a semiconductor light-emitting device package according to an exemplary embodiment is applied to an illumination apparatus.

FIG. 13 illustrates an example in which a semiconductor light-emitting device package according to an exemplary embodiment is applied to an illumination apparatus.

Referring to an exploded perspective view of FIG. 13, the illumination apparatus 5000 is illustrated as a bulb-type lamp as an example, and includes a light-emitting module 5010, a driving unit 5020, and an external connection portion 5030. In addition, external structures, such as external and internal housings 5040 and 5050 and a cover 5060, may be further included.

The light-emitting module 5010 may include a semiconductor light-emitting device 5011 having the same structure as the semiconductor light-emitting device 1 of FIG. 1, or a similar structure thereto, and a circuit board 5012 with the semiconductor light-emitting device 5011 mounted thereon. In the exemplary embodiment, a single semiconductor light-emitting device 5011 is mounted on the circuit board 5012, but a plurality of semiconductor light-emitting devices 5011 may be mounted as needed. In addition, the semiconductor light-emitting device 5011 may be not directly mounted on the circuit board 5012, but mounted after being fabricated in a package type.

The external housing 5040 may function as a heat dissipation unit, and include a heat dissipation plate 5041 in direct contact with the light-emitting module 5010 to enhance a heat dissipation effect, and a heat radiation fin 5042 surrounding side surfaces of the external housing 5040. The cover 5060 may be installed on the light-emitting module 5010, and have a convex lens shape. The driving unit 5020 may be installed in the internal housing 5050 and connected to the external connection portion 5030, such as a socket structure, to receive power from an external power source. In addition, the driving unit 5020 may function to convert the power to an appropriate current source capable of driving the semiconductor light-emitting device 5011 of the light-emitting module 5010. For example, the driving unit 5020 may be configured as an AC-DC converter, a rectifying circuit component, or the like.

In addition, although not illustrated in the drawings, the illumination apparatus 5000 may further include a communications module.

Figure 14:
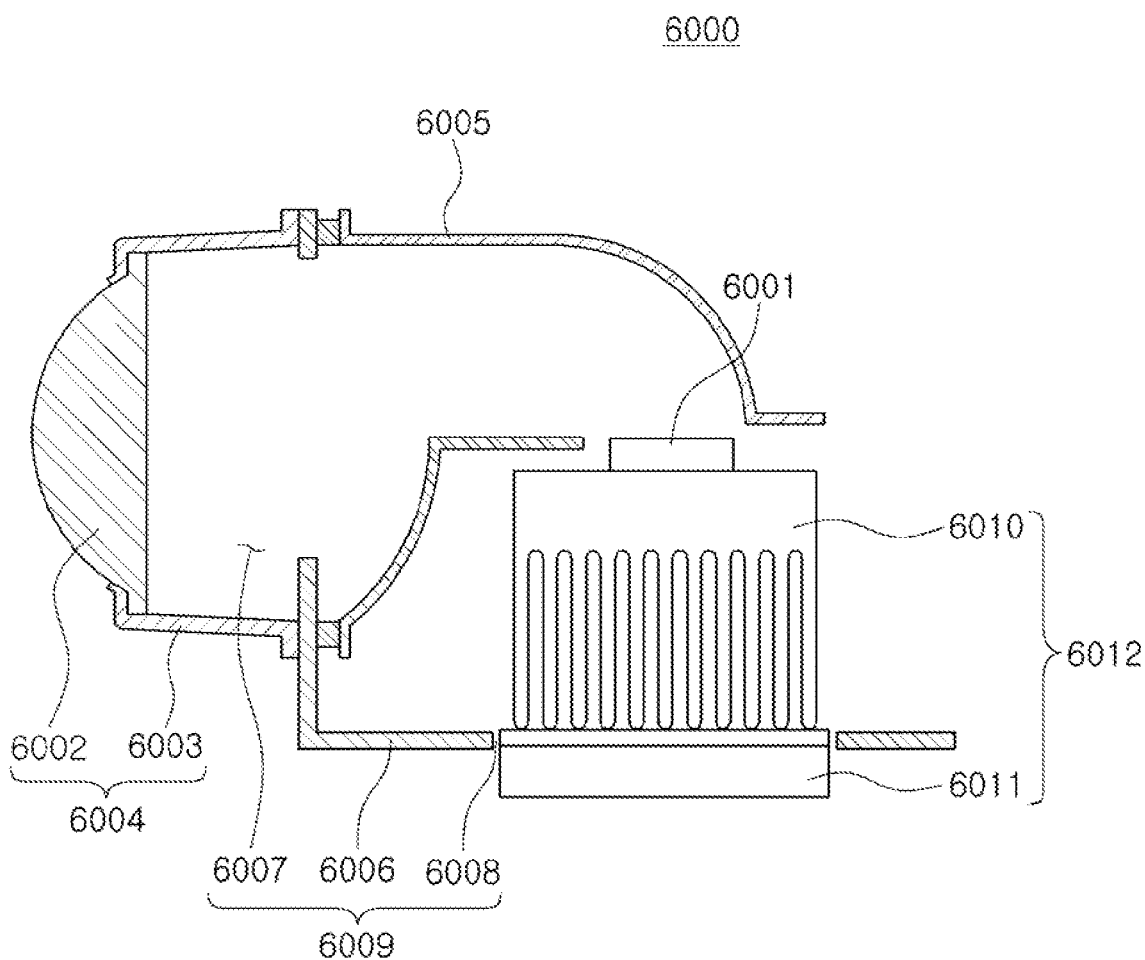
FIG. 14 illustrates an example in which a semiconductor light-emitting device package according to an exemplary embodiment is applied to a headlamp.

FIG. 14 illustrates an example in which a semiconductor light-emitting device according to an exemplary embodiment of the present disclosure is applied to a headlamp.

Referring to FIG. 14, a headlamp 6000 used as a vehicle lamp, or the like, may include a light source 6001, a reflective unit 6005, and a lens cover unit 6004. The lens cover unit 6004 may include a hollow-type guide 6003 and a lens 6002. The light source 6001 may include the above-described semiconductor light-emitting device or the package including the semiconductor light-emitting device.

The headlamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. In addition, the headlamp 6000 may further include a housing 6009 fixedly supporting the heat dissipation unit 6012 and the reflective unit 6005. The housing 6009 may include a body 6006 and a central hole 6008 formed in one surface thereof, in which the heat dissipation unit 6012 is coupled.

The housing 6009 may include a front hole 6007 formed on the other surface integrally connected to the one surface and bent in a right angle direction and fixing the reflective unit 6005 to be disposed above the light source 6001. Accordingly, a front side of the housing 6009 may be open by the reflective unit 6005. The reflective unit 6005 is fixed to the housing 6009 such that the opened front side corresponds to the front hole 6007, and thereby light reflected by the reflective unit 6005 may pass through the front hole 6007 to be emitted outwardly.

As set forth above, according to the exemplary embodiments, a semiconductor light-emitting device and a semiconductor light-emitting device package having no optical and mechanical interference due to a protective device and no increase in a package size may be provided.

While exemplary embodiments have been shown and described above, it will be apparent to those skilled in the art that modifications and variations could be made without departing from the scope of the invention as defined by the appended claims.

What is claimed is:

1. A semiconductor light-emitting device comprising:
   a light-emitting diode (LED) chip comprising a first plane on which first and second electrodes are disposed and a second plane disposed opposite to the first plane;
   first and second solder bumps disposed in bonding areas of the first and second electrodes, respectively; and
   a protective device electrically connected to the first and second electrodes and mounted on the first plane of the LED chip,
   wherein the protective device has a substantially same thickness, measured in a vertical direction with respect to a horizontal plane of the chip, as each of the first and second solder bumps.

2. The semiconductor light-emitting device of claim 1, further comprising an encapsulating layer covering side surfaces of the first and second solder bumps and a side surface of the protective device.

3. The semiconductor light-emitting device of claim 2, wherein a lower surface of the encapsulating layer is a planar surface.

4. The semiconductor light-emitting device of claim 2, wherein the encapsulating layer comprises a reflective powder.

5. The semiconductor light-emitting device claim 2, wherein a lower surface of the encapsulating layer and lower surfaces of the first and second solder bumps are disposed on the same plane.

6. The semiconductor light-emitting device of claim 4, wherein the reflective powder comprises at least one of $TiO_2$, $SiO_2$, and $Al_2O_3$.

7. The semiconductor light-emitting device of claim 1, wherein lower surfaces of the first and second solder bumps and a lower surface of the protective device are disposed on the same plane.

8. The semiconductor light-emitting device of claim 1, wherein the protective device comprises a Zener diode.

9. The semiconductor light-emitting device of claim 8, wherein the Zener diode comprises first and second mounting electrodes disposed on a surface in contact with the first plane of the LED chip.

10. The semiconductor light-emitting device of claim 9, wherein the first and second mounting electrodes are directly connected to the first and second solder bumps disposed on the bonding areas of the first and second electrodes, respectively.

11. The semiconductor light-emitting device of claim 1, wherein the protective device comprises a material containing Si.

12. The semiconductor light-emitting device of claim 11, wherein a material forming the lower surface of the protection diode comprises undoped Si.

13. The semiconductor light-emitting device of claim 1, wherein the protective device comprises first and second mounting electrodes, and
   wherein the first and second mounting electrodes are connected to the first and second electrodes in parallel so as to have a reverse polarity to a polarity of the first and second electrodes.

14. The semiconductor light-emitting device of claim 1, wherein the protective device has a thickness smaller than each of the first and second solder bumps, and is disposed in an area between the first and second solder bumps.

15. The semiconductor light-emitting device of claim 1, further comprising a first conductive-type semiconductor layer, a second conductive-type semiconductor layer, and an active layer interposed between the first and second conductive-type semiconductor layers,
   wherein the first and second electrodes are disposed on upper surfaces of the first and second conductive-type semiconductor layers, respectively.

16. The semiconductor light-emitting device of claim 15, further comprising:
   an insulating layer disposed on the first and second conductive-type semiconductor layers; and a metal layer disposed on the insulating layer,
   wherein the insulating layer comprises a plurality of openings exposing the first and second electrodes, and
   wherein the openings are disposed below the first and second solder bumps.

17. The semiconductor light-emitting device of claim 16, wherein the metal layer comprises a first metal layer and a second metal layer insulated from each other, and
   wherein the first electrode is connected to the first metal layer through at least one of the openings, and the second electrode is connected to the second metal layer through another at least one of the openings.

18. The semiconductor light-emitting device of claim 16, further comprising a passivation layer disposed on the metal layer,
   wherein the metal layer comprises a first metal layer and a second metal layer insulated from each other,
   wherein the passivation layer comprises a plurality of bonding portions exposing the first and second metal layers, and
   wherein at least one bonding portion exposing the second metal layer is not disposed on at least one opening exposing the second electrode, and another at least one bonding portion exposing the first metal layer is disposed on another at least one opening exposing the first electrode.

19. A semiconductor light-emitting device comprising:
   a light-emitting diode (LED) chip comprising a first plane on which first and second electrodes are disposed and a second plane disposed opposite to the first plane;
   at least one first solder bump and at least one second solder bump disposed in bonding areas of the first and second electrodes, respectively;
   a protective device electrically connected to the first and second electrodes and disposed on the first plane of the LED chip; and
   an encapsulating layer covering the first plane and including portions through which lower surfaces of the first and second solder bumps are exposed, wherein the lower surfaces of the first and second solder bumps are adjacent to the LED chip, and wherein a lower surface of the protective device is coplanar with a lower surface of the encapsulating layer.

20. The semiconductor light-emitting device of claim 19, wherein the protective device comprises a Zener diode, and wherein the Zener diode comprises first and second mounting electrodes disposed on a surface in contact with the first plane of the LED chip.

* * * * *